(12) United States Patent
Lai et al.

(10) Patent No.: US 12,364,084 B1
(45) Date of Patent: Jul. 15, 2025

(54) DISPLAY APPARATUS

(71) Applicant: AUO Corporation, Hsinchu (TW)

(72) Inventors: Chun-Chi Lai, Hsinchu (TW);
Chia-Min Wang, Hsinchu (TW);
Wen-Chiuan Su, Hsinchu (TW);
Ling-Ying Chien, Hsinchu (TW);
Ching-Sheng Cheng, Hsinchu (TW);
Li-Wei Shih, Hsinchu (TW)

(73) Assignee: AUO Corporation, Hsinchu (TW)

( * ) Notice: Subject to any disclaimer, the term of this patent is extended or adjusted under 35 U.S.C. 154(b) by 0 days.

(21) Appl. No.: 18/820,321

(22) Filed: Aug. 30, 2024

(30) Foreign Application Priority Data

Apr. 15, 2024 (TW) .................. 113114041

(51) Int. Cl.
| | |
|---|---|
| *H10H 20/857* | (2025.01) |
| *G06F 3/044* | (2006.01) |
| *G06V 40/13* | (2022.01) |
| *H01L 25/16* | (2023.01) |
| *H10D 86/40* | (2025.01) |
| *H10D 86/60* | (2025.01) |

(52) U.S. Cl.
CPC .......... *H10H 20/857* (2025.01); *G06F 3/044* (2013.01); *G06V 40/1318* (2022.01); *H01L 25/167* (2013.01); *H10D 86/441* (2025.01); *H10D 86/60* (2025.01); *G06F 2203/04112* (2013.01)

(58) Field of Classification Search
CPC ................ G06V 40/1318; G06F 3/044; G06F 2203/04112; H10H 20/857; H10D 86/441; H10D 86/60; H01L 25/167

USPC .................................................. 345/173–174
See application file for complete search history.

(56) References Cited

U.S. PATENT DOCUMENTS

| | | | |
|---|---|---|---|
| 10,332,929 | B2 | 6/2019 | Wu |
| 11,803,256 | B2 | 10/2023 | Shim et al. |
| 2017/0219893 | A1* | 8/2017 | Morita .............. G02F 1/134309 |
| 2020/0278747 | A1* | 9/2020 | Ligtenberg ............ G06F 3/0213 |
| 2021/0191552 | A1* | 6/2021 | Bok ........................ H10K 59/38 |
| 2022/0052140 | A1* | 2/2022 | Choi ..................... H10K 59/126 |

(Continued)

FOREIGN PATENT DOCUMENTS

| | | |
|---|---|---|
| CN | 107799541 | 2/2020 |
| KR | 20230016737 | 2/2023 |

(Continued)

Primary Examiner — Kwin Xie
(74) Attorney, Agent, or Firm — JCIPRNET

(57) ABSTRACT

A display apparatus includes a first pad group, a first light-emitting element, a pixel driving structure, a first conductive layer and a second conductive layer. The first conductive layer is disposed between the first pad group and the pixel driving structure. The first conductive layer includes a first conductive pattern and a second conductive pattern. The first conductive pattern is electrically connected to one of the plurality of first pads and the pixel driving structure. The second conductive pattern is electrically connected to another one of the plurality of first pads. The first conductive pattern and the second conductive pattern have a first light-transmitting gap. The first light-transmitting gap is located below the first light-emitting element. The second conductive layer is disposed between the first conductive layer and the pixel driving structure. The second conductive layer includes a third conductive pattern shielding the first light-transmitting gap.

8 Claims, 10 Drawing Sheets

(56) References Cited

U.S. PATENT DOCUMENTS

| | | |
|---|---|---|
| 2023/0023671 A1 | 1/2023 | Shim et al. |
| 2023/0120673 A1* | 4/2023 | Bok .................. G06V 40/1318 |
| | | 345/174 |
| 2023/0197764 A1* | 6/2023 | Lee ........................ H10H 20/01 |
| | | 257/79 |
| 2023/0237937 A1 | 7/2023 | Choi et al. |

FOREIGN PATENT DOCUMENTS

| | | |
|---|---|---|
| KR | 20230116154 | 8/2023 |
| TW | 201624086 | 7/2016 |

* cited by examiner

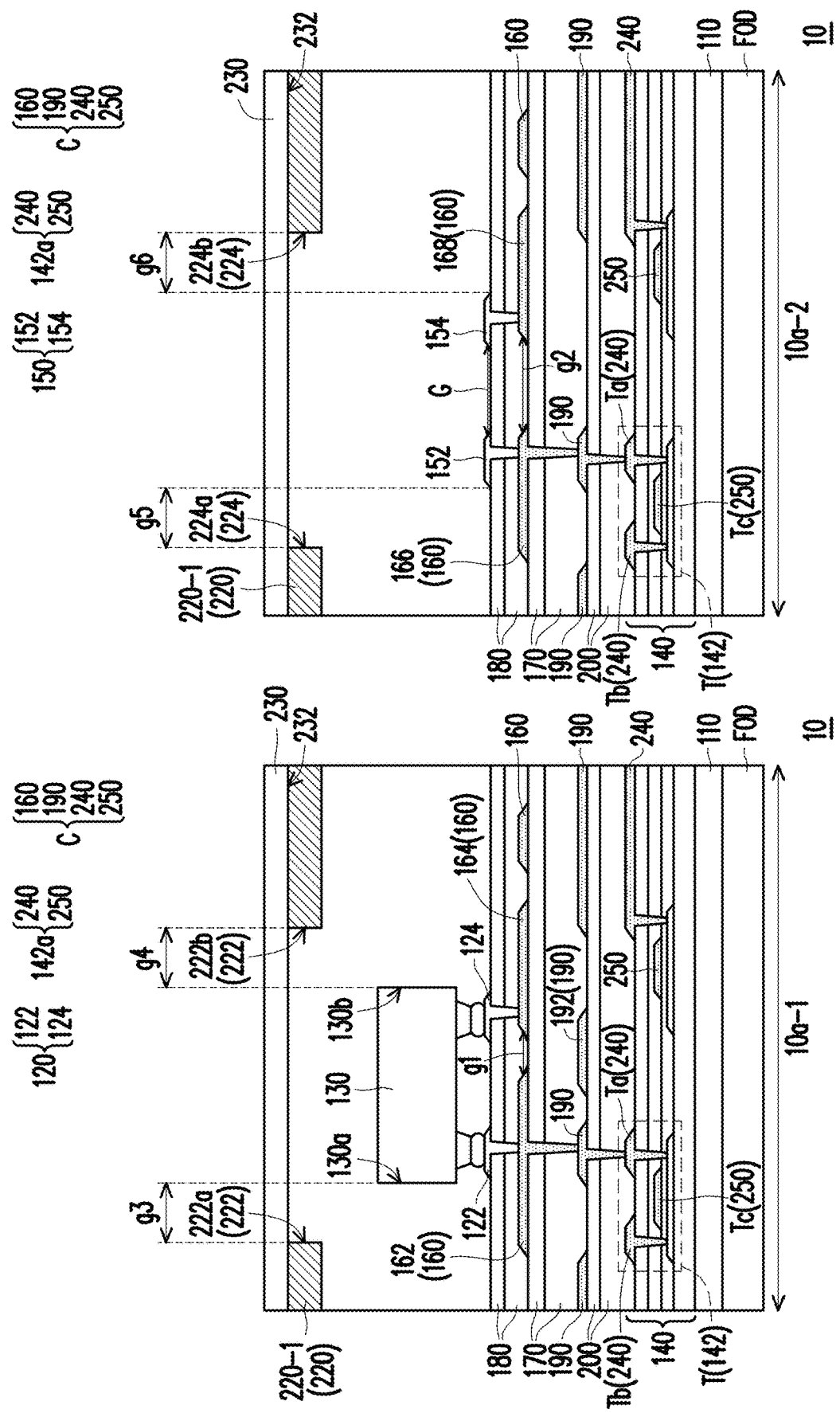

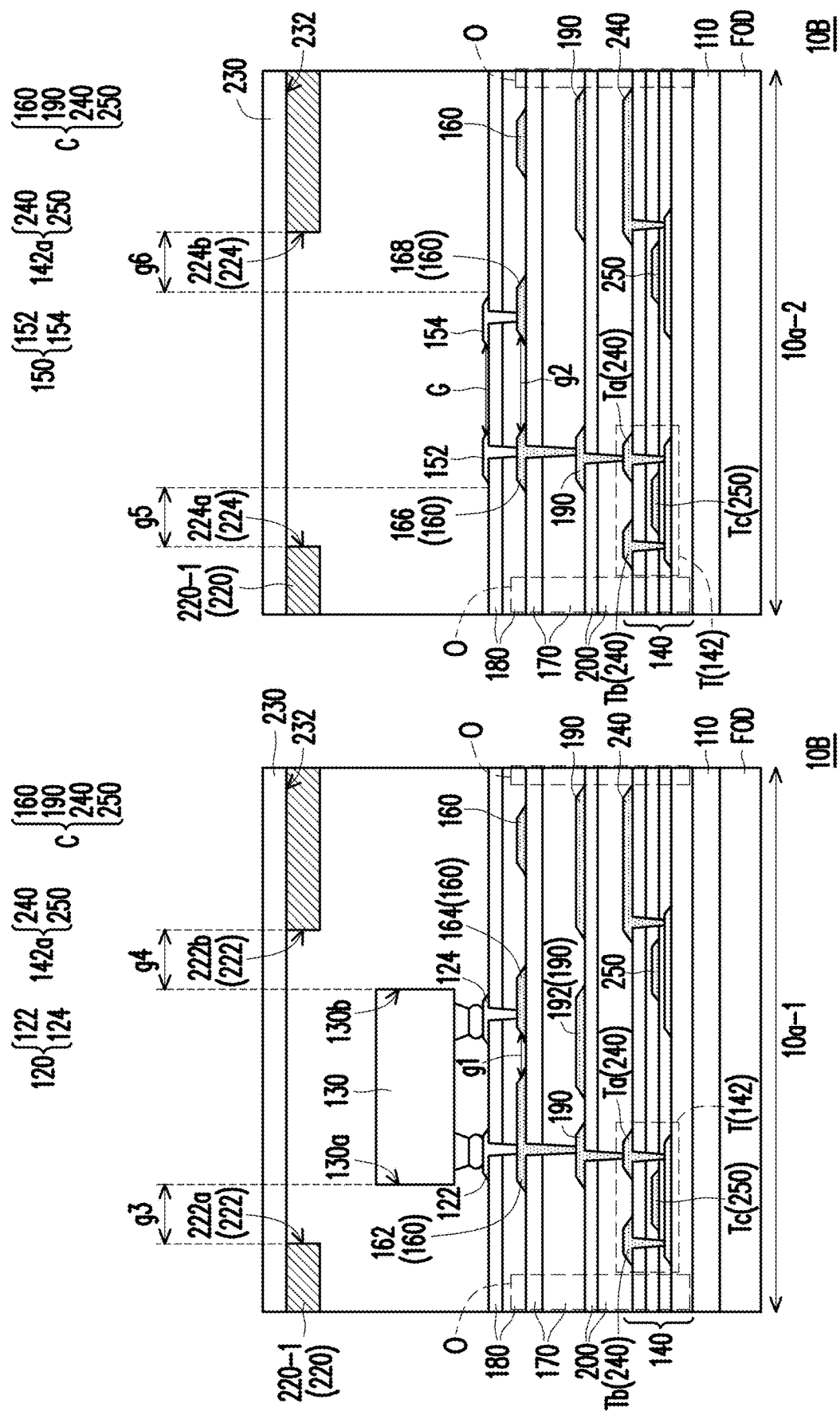

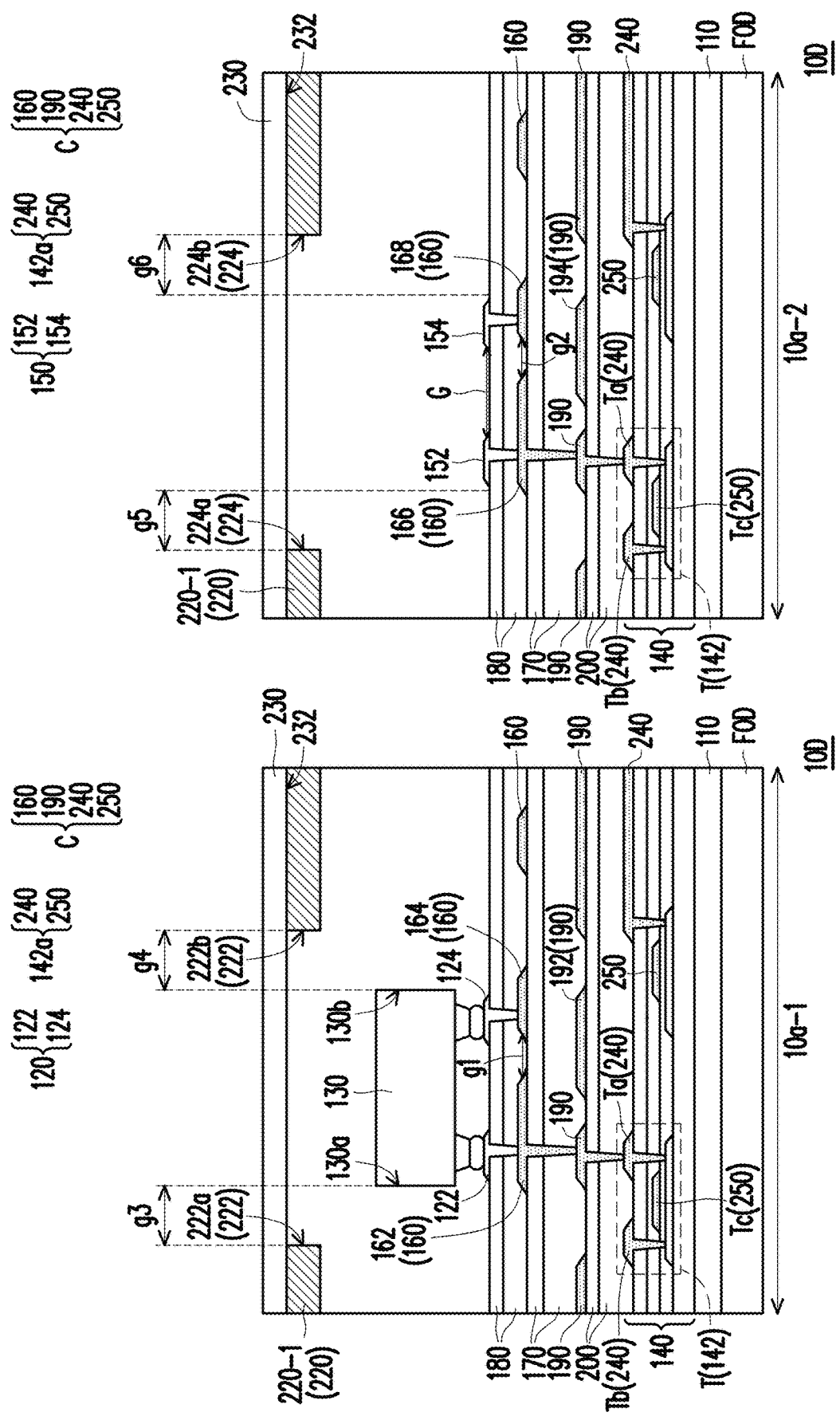

DISPLAY APPARATUS

CROSS-REFERENCE TO RELATED APPLICATION

This application claims the priority benefit of Taiwan application serial no. 113114041, filed on Apr. 15, 2024. The entirety of the above-mentioned patent application is hereby incorporated by reference herein and made a part of this specification.

BACKGROUND

Technical Field

The disclosure relates to an optoelectronic apparatus, and in particular to a display apparatus.

Description of Related Art

The fingerprint sensing device includes an optical fingerprint sensing device. The principle of optical fingerprint sensing is as follows. Fingerprints are composed of multiple irregular crests and troughs. When a finger presses the fingerprint sensing device, the crests contact the fingerprint sensing device, while the troughs do not contact the fingerprint sensing device. The crests directly reflects the light beam to the light sensor, thereby forming a bright area. At the same time, the light beam transmitting to the troughs will be reflected multiple times in the troughs before being transmitted to the light sensor, thereby forming a dark area. In this way, the light beams corresponding to the crests and the troughs of the fingerprint will form a light and dark stripe pattern on the light receiving surface of the light sensor, thereby obtaining a fingerprint image. Using algorithms to calculate information corresponding to the fingerprint image, user identity can be identified.

High screen-to-body ratio and full-screen design have become the mainstream specifications for small and medium-sized display panels. In order to achieve a high screen-to-body ratio and a full screen, the light sensor used to obtain the fingerprint image can be placed under the display panel. However, when the light-emitting elements of the display panel emit light to display an image, the light beam emitted by the light-emitting elements will pass through the display panel and be transmitted to the light sensor below the display panel, causing the light sensor to be overexposed and unable to identify the fingerprint.

SUMMARY

This disclosure provides a display apparatus with good performance.

The display apparatus of this disclosure includes a first pad group, a first light-emitting element, a pixel driving structure, a first conductive layer and a second conductive layer. The first pad group includes first pads. The first light-emitting element is bonded to the first pads. The first conductive layer is disposed between the first pad group and the pixel driving structure. The first conductive layer includes a first conductive pattern and a second conductive pattern. The first conductive pattern is electrically connected to one of the first pads and the pixel driving structure. The second conductive pattern is separated from the first conductive pattern. The second conductive pattern is electrically connected to another one of the first pads. The first conductive pattern and the second conductive pattern have a first light-transmitting gap. The first light-transmitting gap is located below the first light-emitting element. The second conductive layer is disposed between the first conductive layer and the pixel driving structure. The second conductive layer includes the third conductive pattern shielding the first light-transmitting gap of the first conductive pattern and the second conductive pattern.

BRIEF DESCRIPTION OF THE DRAWINGS

FIG. 2 is a schematic cross-sectional view of the main sub-area of the pixel area of the display apparatus according to the first embodiment of the present disclosure.

FIG. 3 is a schematic cross-sectional view of a redundancy sub-area of the pixel area of the display apparatus according to the first embodiment of the present disclosure.

FIG. 8 is a schematic cross-sectional view of the main sub-area of the pixel area of the display apparatus according to the third embodiment of the present disclosure.

FIG. 9 is a schematic cross-sectional view of the redundancy sub-area of the pixel area of the display apparatus according to the third embodiment of the present disclosure.

FIG. 14 is a schematic cross-sectional view of the main sub-area of the pixel area of the display apparatus according to the fifth embodiment of this disclosure.

FIG. 15 is a schematic cross-sectional view of the redundancy sub-area of the pixel area of the display apparatus according to the fifth embodiment of the present disclosure.

DESCRIPTION OF THE EMBODIMENTS

Figure 1:
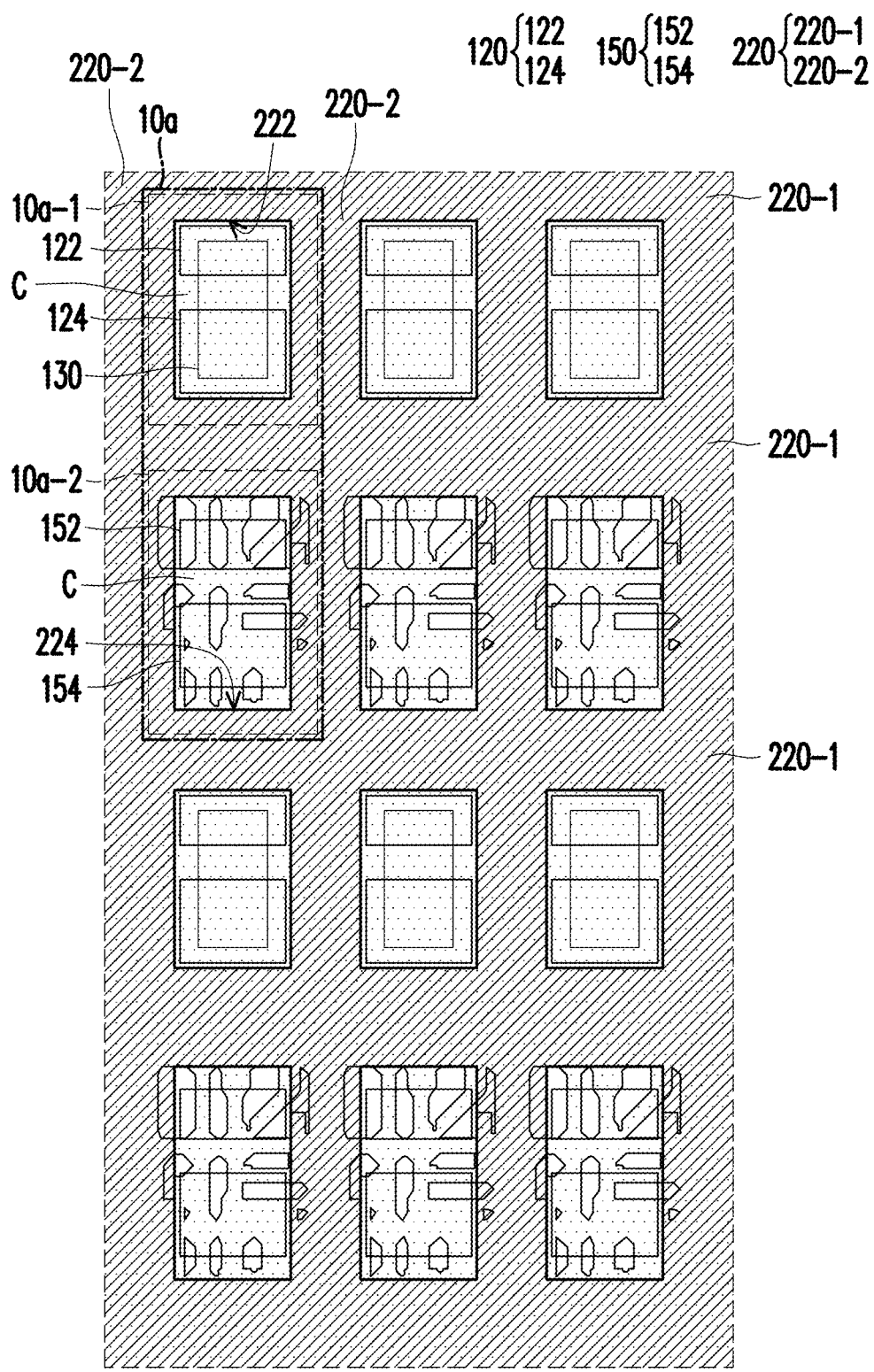
FIG. 1 is a schematic top view of the display apparatus of the first embodiment of the present disclosure.

Reference will now be made in detail to exemplary embodiments provided in the disclosure, examples of which are illustrated in accompanying drawings. Wherever possible, identical reference numerals are used in the drawings and descriptions to refer to identical or similar parts.

It should be understood that when a device such as a layer, film, region or substrate is referred to as being "on" or "connected to" another device, it may be directly on or connected to another device, or intervening devices may also be present. In contrast, when a device is referred to as being "directly on" or "directly connected to" another device, there are no intervening devices present. As used herein, the term "connected" may refer to physical connection and/or electrical connection. Besides, if two devices are "electrically connected" or "coupled", it is possible that other devices are present between these two devices.

The term "about," "approximately," or "substantially" as used herein is inclusive of the stated value and a mean within an acceptable range of deviation for the particular value as determined by people having ordinary skill in the art, considering the measurement in question and the error associated with measurement of the particular quantity (i.e., the limitations of the measurement system). For example, "about" may mean within one or more standard deviations, for example, ±30%, ±20%, ±10%, or ±5% of the stated value. Moreover, a relatively acceptable range of deviation or standard deviation may be chosen for the term "about," "approximately," or "substantially" as used herein based on optical properties, etching properties or other properties, instead of applying one standard deviation across all the properties.

Unless otherwise defined, all terms (including technical and scientific terms) used herein have the same meaning as commonly understood by people of ordinary skill in the art. It will be further understood that terms, such as those defined in the commonly used dictionaries, should be interpreted as having a meaning that is consistent with their meaning in the context of the relevant art and the invention and will not be interpreted in an idealized or overly formal sense unless expressly so defined herein.

FIG. 1 is a schematic top view of the display apparatus of the first embodiment of the present disclosure. FIG. 2 is a schematic cross-sectional view of the main sub-area of the pixel area of the display apparatus according to the first embodiment of the present disclosure. FIG. 3 is a schematic cross-sectional view of a redundancy sub-area of the pixel area of the display apparatus according to the first embodiment of the present disclosure. It should be noted that FIG. 1 represents a set C of the first conductive layer 160, the second conductive layer 190 and the light blocking portion 142a of the driving circuit layer 140 of FIG. 2 and FIG. 3 with an entire pattern in which a plurality of dots are drawn.

Referring to FIG. 1 and FIG. 2, the display apparatus 10 includes pixel areas 10a arranged in an array on a base 110. Each of the pixel area 10a includes a main sub-area 10a-1, wherein the main sub-area 10a-1 includes a first pad group 120 and a first light-emitting element 130, the first pad group 120 includes first pads 122, 124, and the first light-emitting element 130 is bonded to the first pads 122, 124.

The pixel areas 10a of the display apparatus 10 include a driving circuit layer 140. The driving circuit layer 140 includes pixel driving structures 142. A first pad group 120 of a main sub-area 10a-1 of each of the pixel area 10a is electrically connected to a corresponding pixel driving structure 142. For example, in some embodiments, each of the pixel driving structure 142 may include a thin film transistor T and a common electrode (not shown), one of the first pads 122 of the first pad group 120 is electrically connected to the thin film transistor T, and another one of the first pads 122 of the first pad group 120 is electrically connected to the common electrode.

Referring to FIG. 1, FIG. 2 and FIG. 3, in some embodiments, each of the pixel area 10a may further include a redundancy sub-area 10a-2 located beside the main sub-area 10a-1. The redundancy sub-area 10a-2 includes a second pad group 150, wherein the second pad group 150 is disposed beside the first pad group 120 and includes second pads 152, 154. The second pads 152, 154 of the redundancy sub-area 10a-2 of the same pixel area 10a are electrically connected to the first pads 122, 124 of the main sub-area 10a-1 of the same pixel area 10a, respectively. For example, in some embodiments, the first pad 122 and the second pad 152 of the same pixel area 10a are electrically connected to the corresponding thin film transistor T of a pixel driving structure 142, and another first pad 124 and another second pad 154 of the same pixel area 10a are electrically connected to the common electrode.

In some embodiments, the first pads 122, 124 of the main sub-area 10a-1 of each of the pixel area 10a are used to bond with the first transposed first light-emitting element 130. In some embodiments, the second pads 152, 154 of the redundancy sub-area 10a-2 of each of the pixel area 10a are used to bond with a second light-emitting element (not shown) for repair. The second pads 152, 154 may or may not be provided with the second light-emitting element, depending on whether the pixel area 10a has been repaired. In some embodiments, the first light-emitting element 130 and the second light-emitting element are, for example, micro light-emitting diodes (μLED), but this disclosure is not limited to thereto.

Referring to FIG. 2 and FIG. 3, the display apparatus 10 further includes a first conductive layer 160 disposed between the first pad group 120 and the pixel driving structure 142. In some embodiments, the first conductive layer 160 is further disposed between the second pad group 150 and the pixel driving structure 142. Specifically, in some embodiments, the display apparatus 10 further includes a first insulating layer 170 and a second insulating layer 180, the first insulating layer 170 is disposed on the driving circuit layer 140, the first conductive layer 160 is disposed on the first insulating layer 170, the second insulating layer 180 covers the first conductive layer 160, and the first pad group 120 and the second pad group 150 are disposed on the second insulating layer 180.

In some embodiments, the first insulating layer 170 and the second insulating layer 180 may be a single film layer or a stack of multiple film layers, and the materials of the first insulating layer 170 and the second insulating layer 180 may be inorganic materials (for example: silicon oxide, silicon nitride, nitrogen Silicon oxide, or a stacked layer of at least two of the above materials), organic material or a combination of the above.

The first conductive layer 160 can block light. In some embodiments, based on conductivity considerations, the first conductive layer 160 generally uses a metal material. However, this disclosure is not limited thereto. According to other embodiments, the first conductive layer 160 may also use other conductive materials, such as alloys, nitrides of metal materials, oxides of metal materials, oxynitrides of metal materials, or a metal material stacked layers with other conductive material.

Referring to FIG. 2, the first conductive layer 160 includes a first conductive pattern 162 and a second conductive pattern 164. The first conductive pattern 162 is electrically connected to a first pad 122 and the pixel driving structure 142. The second conductive pattern 164 is separated from the first conductive pattern 162. The second conductive pattern 164 is electrically connected to another first pad 124. The first conductive pattern 162 and the second conductive pattern 164 have a first light-transmitting gap g1. The first light-transmitting gap g1 is located below the first light-emitting element 130. Specifically, at least a portion of the first light-transmitting gap g1 is located within a vertical projection area of the first light-emitting element 130.

Referring to FIG. 3, in some embodiments, the first conductive layer 160 further includes a fourth conductive pattern 166 and a fifth conductive pattern 168. The fourth conductive pattern 166 is electrically connected to a second pad 152 and the pixel driving structure 142. The fifth conductive pattern 168 is separated from the fourth conductive pattern 166. The fifth conductive pattern 168 is electrically connected to another second pad 154. The fourth conductive pattern 166 and the fifth conductive pattern 168 have a second light-transmitting gap g2. The second pads 152, 154 of the second pad group 150 have a pad gap G, and the second light-transmitting gap g2 is located below the pad gap G of the second pads 152, 154. Specifically, at least a portion of the second light-transmitting gap g2 is located within the vertical projection area of the pad gap G of the second pads 152, 154.

Referring to FIG. 2 and FIG. 3, the display apparatus 10 further includes a second conductive layer 190 disposed between the first conductive layer 160 and the driving circuit layer 140. Specifically, in some embodiments, the display apparatus 10 further includes a third insulating layer 200, the third insulating layer 200 covers the driving circuit layer 140, the second conductive layer 190 is disposed on the third insulating layer 200, the first insulating layer 170 covers the second conductive layer 190, and the first conductive layer 160 is disposed on the first insulating layer 170.

In some embodiments, the third insulating layer 200 may be a single film layer or a stack of multiple film layers. The material of the third insulating layer 200 may be an inorganic material (for example: silicon oxide, silicon nitride, silicon oxynitride, or at least two of the above. stacked layers of materials), organic materials, or a combination of the above.

The second conductive layer 190 can block light. In some embodiments, based on conductivity considerations, the second conductive layer 190 is generally made of metal material. However, this disclosure is not limited thereto. According to other embodiments, the second conductive layer 190 may also use other conductive materials, such as alloys, nitrides of metal materials, oxides of metal materials, oxynitrides of metal materials, or a metal material stacked layers with other conductive materials.

Referring to FIG. 2 and FIG. 3, in some embodiments, the display apparatus 10 further includes a light sensor FOD disposed below the first conductive layer 160 and the second conductive layer 190. In some embodiments, the light sensor FOD is used to receive a light beam reflected by the fingerprint (not shown), thereby realizing the fingerprint recognition function. For example, in some embodiments, the driving circuit layer 140, the first conductive layer 160 and the second conductive layer 190 are disposed on the upper side of the base 110, and the light sensor FOD may be selectively disposed on the lower side of the base 110, but this disclosure is not limited to thereto.

Referring to FIG. 2, it should be noted that the second conductive layer 190 includes a third conductive pattern 192. The third conductive pattern 192 shields the first light-transmitting gap g1 of the first conductive pattern 162 and the second conductive pattern 164. Thereby, the light beam emitted by the first light-emitting element 130 is not easily transmitted to the light sensor FOD excessively, and the light sensor FOD is not easily overexposed. That is to say, when the first light-emitting element 130 emits light (that is, when the display apparatus 10 displays a picture), the light sensor FOD can still normally sense the light beam reflected by the fingerprint, thereby performing a normal imaging function.

Referring to FIG. 1 and FIG. 2, in some embodiments, in a top view of the display apparatus 10, a set of the first conductive layer 160 and the second conductive layer 190 (or a set C of the first conductive layer 160, the second conductive layer 190 and the light blocking portion 142a of the driving circuit layer 140) in the main sub-area 10a-1 of the pixel area 10a may not have any opening. That is, in some embodiments, an area right under the first light-emitting element 130 may be completely shielded by the set of the first conductive layer 160 and the second conductive layer 190 (or a set C of the first conductive layer 160, the second conductive layer 190 and the light blocking portion 142a of the driving circuit layer 140).

Referring to FIG. 1 and FIG. 2, in some embodiments, the display apparatus 10 further includes a mesh touch electrode 220, wherein the first light-emitting element 130 is located between the mesh touch electrode 220 and the first pad group 120. For example, in some embodiments, the display apparatus 10 further includes a translucent protective cover 230 disposed opposite the base 110. The first light-emitting element 130 is located between the translucent protective cover 230 and the base 110, and the mesh touch electrode 220 is optionally disposed on a surface 232 of the translucent protective cover 230 facing the first light-emitting element 130, but this disclosure is not limited to thereto.

Referring to FIG. 1 and FIG. 2, the mesh touch electrode 220 has a first mesh 222. The first light-emitting element 130 is disposed below the first mesh 222, and the first light-emitting element 130 is located between the mesh touch electrode 220 and the first pad group 120. In some embodiments, the first mesh 222 corresponds to main sub-area 10a-1 of pixel area 10a. Referring to FIG. 1 and FIG. 3, in some embodiments, the mesh touch electrode 220 further has a second mesh 224 located outside the first mesh 222, and the second pads 152, 154 of the second pad group 150 are located below the second mesh 224 of the mesh touch electrode 220. In some embodiments, the second mesh 224 corresponds to the redundancy sub-area 10a-2 of the pixel area 10a.

Referring to FIG. 1 and FIG. 2, the first mesh 222 of the mesh touch electrode 220 has a first edge 222a and a second edge 222b opposite to each other. The first light-emitting element 130 has a first edge 130a and a second edge 130b opposite to each other, which respectively correspond to the first edge 222a and the second edge 222b of the first mesh 222. In some embodiments, the first edge 130a of the first light-emitting element 130 and the first edge 222a of the first mesh 222 have a third light-transmitting gap g3, and the first conductive pattern 162 extends from below the first pad 122 to below the mesh touch electrode 220 to shield the third light-transmitting gap g3. In some embodiments, the second edge 130b of the first light-emitting element 130 and the second edge 222b of the first mesh 222 have a fourth light-transmitting gap g4, and the second conductive pattern 164 extends from below another first pad 124 to below the mesh touch electrode 220 to shield the fourth light-transmitting gap g4.

Referring to FIG. 1 and FIG. 3, the second mesh 224 of the mesh touch electrode 220 has a first edge 224a and a second edge 224b opposite to each other. The second pad 152 and the first edge 224a of the second mesh 224 have a fifth light-transmitting gap g5. The fourth conductive pattern 166 extends from below the second pad 152 to below the mesh touch electrode 220 to shield the fifth light-transmitting gap g5. Another second pad 154 and the second edge 224b of the second mesh 224 have a sixth light-transmitting gap g6. The fifth conductive pattern 168 extends from below another second pad 154 to below the mesh touch electrode 220 to shield the sixth light-transmitting gap g6.

Referring to FIG. 1, FIG. 2 and FIG. 3, the mesh touch electrode 220 has first solid portions 220-1 and second solid portions 220-2, wherein the first solid portions 220-1 and the second solid portions 220-2 are intersected to define the first meshes 222. In some embodiments, the first solid portions 220-1 and the second solid portions 220-2 are intersected to further define second meshes 224. In some embodiments, the first solid portions 220-1 of the mesh touch electrode 220 fall within the area of the set C of the light blocking portion 142a of the pixel driving structure 142, the solid portion of the first conductive layer 160 and the solid portion of the second conductive layer 190. In some embodiments, in the top view of the display apparatus 10, right below the areas of the first solid portions 220-1 of the mesh touch electrode 220, the set C of the light blocking portion 142a of the pixel driving structure 142, the solid portion of the first conductive layer 160 and the solid portion of the second conductive layer 190 may have no openings. For example, in some embodiments, the pixel driving structure 142 includes a thin film transistor T having a first terminal Ta, a second terminal Tb, and a control terminal Tc, and the light blocking portion 142a of the pixel driving structure 142 may include light-blocking conductive layers 240 and 250 to which the first terminal Ta, the second terminal Tb and the control terminal Tc belong, but this disclosure is not limited to thereto.

It must be noted here that the following embodiments follow the component numbers and part of the content of the previous embodiments, wherein the same numbers are used to represent the same or similar elements, and descriptions of the same technical content are omitted. For descriptions of omitted parts, please refer to the foregoing embodiments and will not be repeated in the following embodiments.

Figure 4:
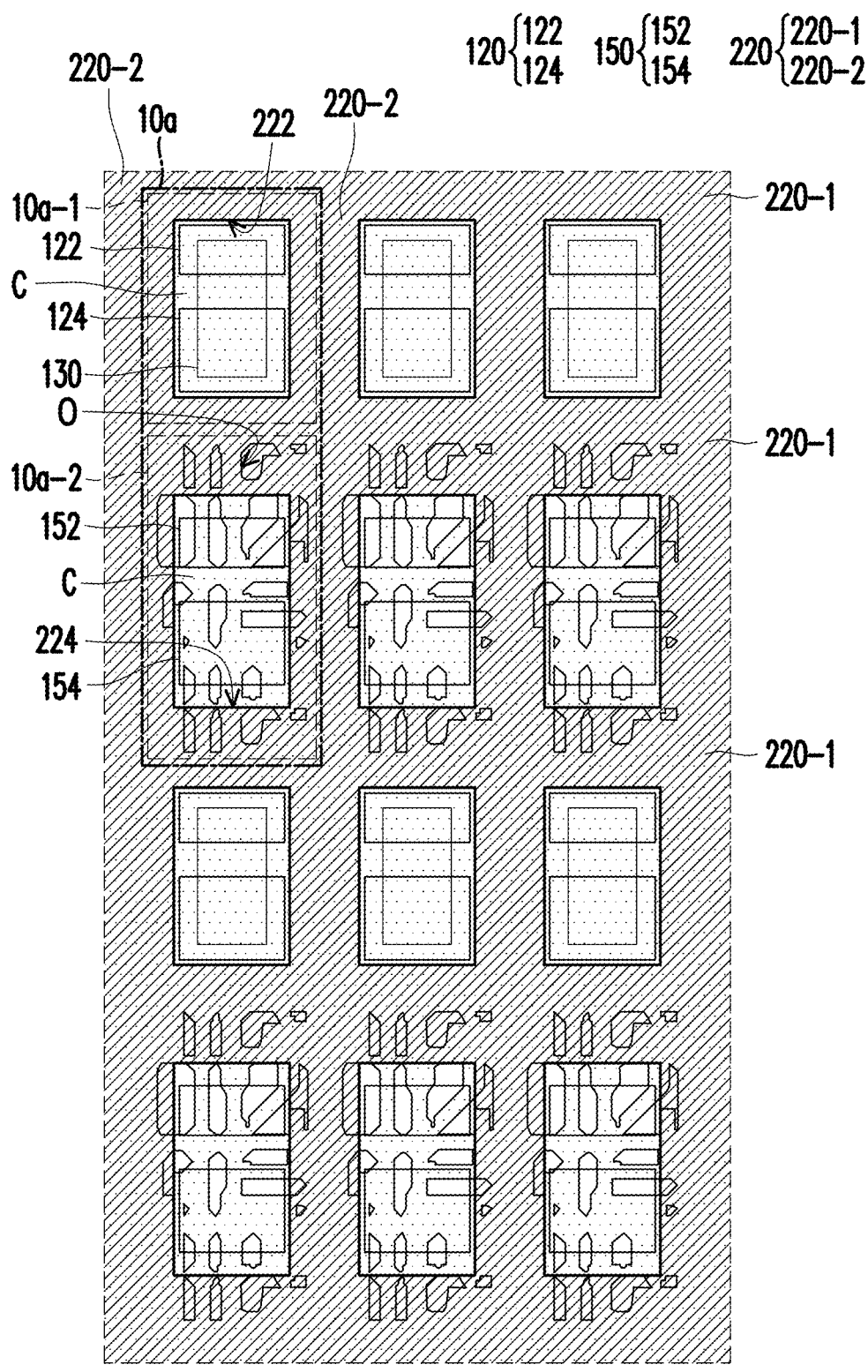
FIG. 4 is a schematic top view of the display apparatus of the second embodiment of the present disclosure.
Figures 5, 6:
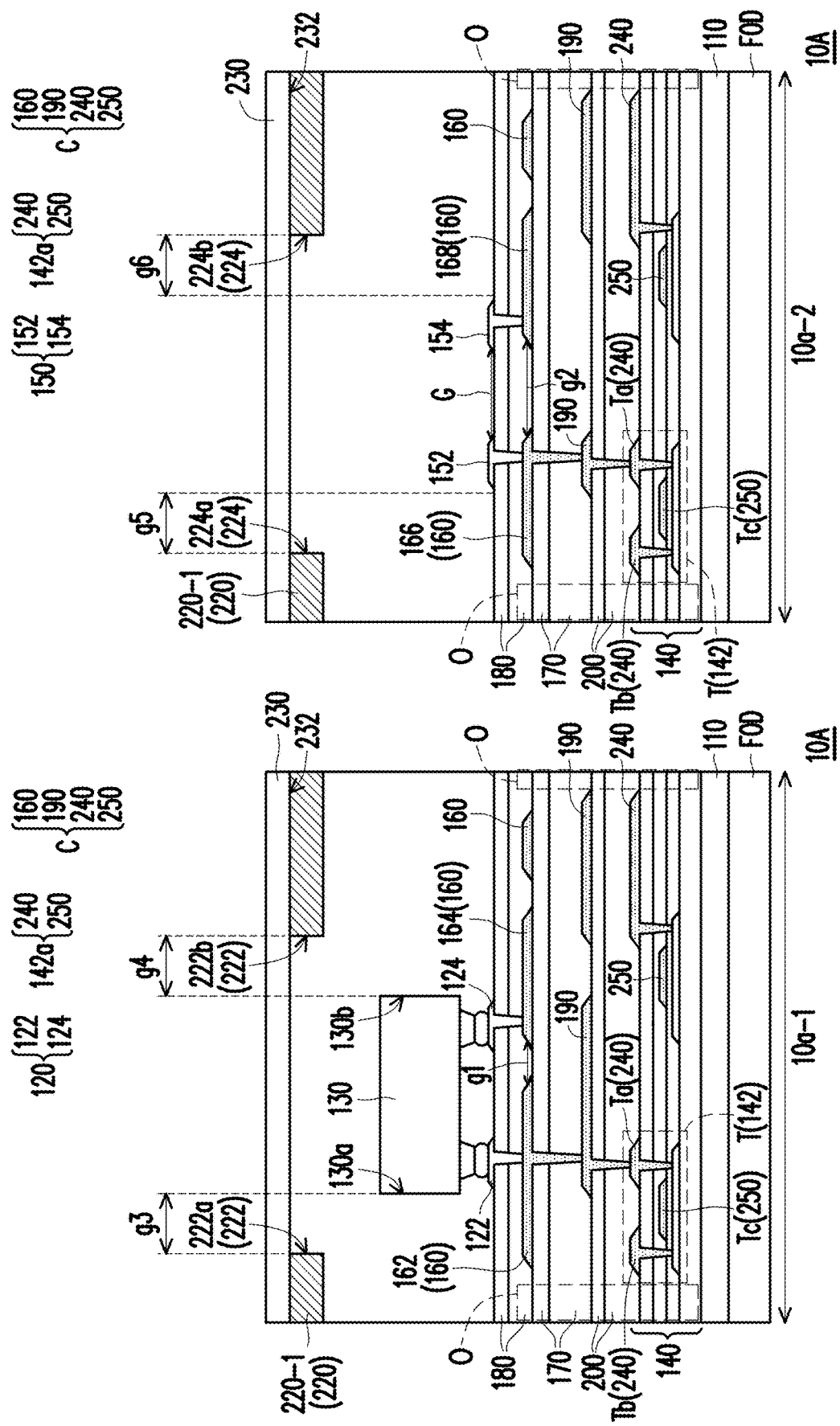
FIG. 5 is a schematic cross-sectional view of the main sub-area of the pixel area of the display apparatus according to the second embodiment of the present disclosure.
FIG. 6 is a schematic cross-sectional view of the redundancy sub-area of the pixel area of the display apparatus according to the second embodiment of the present disclosure.

FIG. 4 is a schematic top view of the display apparatus of the second embodiment of the present disclosure. FIG. 5 is a schematic cross-sectional view of the main sub-area of the pixel area of the display apparatus according to the second embodiment of the present disclosure. FIG. 6 is a schematic cross-sectional view of the redundancy sub-area of the pixel area of the display apparatus according to the second embodiment of the present disclosure. It should be noted that FIG. 4 represents a set C of the first conductive layer 160, the second conductive layer 190 and the light blocking portion 142a of the driving circuit layer 140 of FIG. 5 and FIG. 6 with an entire pattern in which a plurality of dots are drawn.

The display apparatus 10A of the second embodiment of FIG. 4, FIG. 5 and FIG. 6 is similar to the display apparatus 10 of the first embodiment of FIG. 1, FIG. 2 and FIG. 3. The main difference between the two is that in the second embodiment of FIG. 4, FIG. 5 and FIG. 6, in the top view of the display apparatus 10A, right below the area of the first solid portions 220-1 of the mesh touch electrode 220, the set C of the light blocking portion 142a of the pixel driving structure 142, the solid portion of the first conductive layer 160 and the solid portion of the second conductive solid portions of layer 190 may have openings O.

Figure 7:
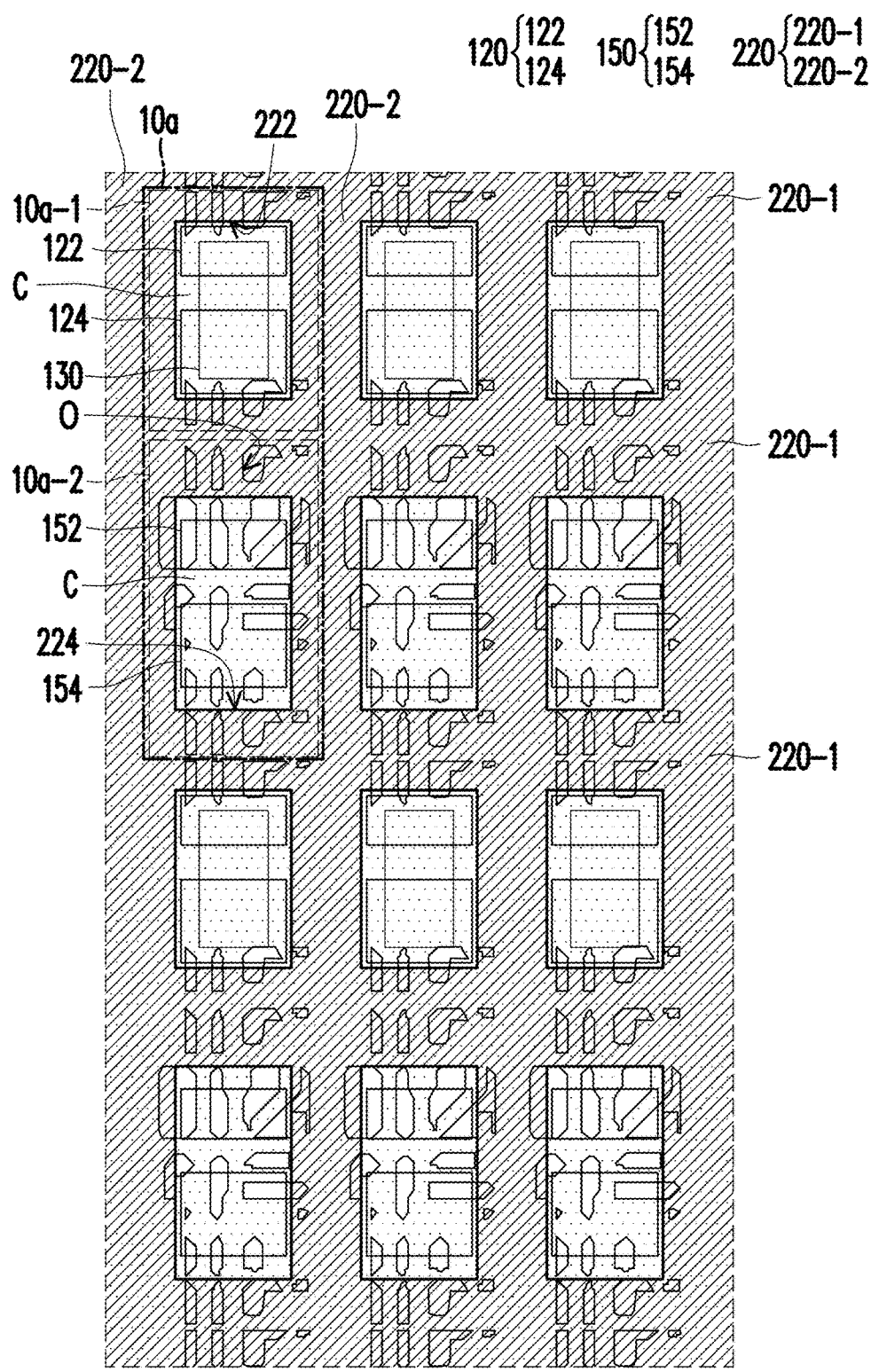
FIG. 7 is a schematic top view of the display apparatus of the third embodiment of the present disclosure.

FIG. 7 is a schematic top view of the display apparatus of the third embodiment of the present disclosure. FIG. 8 is a schematic cross-sectional view of the main sub-area of the pixel area of the display apparatus according to the third embodiment of the present disclosure. FIG. 9 is a schematic cross-sectional view of the redundancy sub-area of the pixel area of the display apparatus according to the third embodiment of the present disclosure. It should be noted that FIG. 7 represents a set C of the first conductive layer 160, the second conductive layer 190 and the light blocking portion 142a of the driving circuit layer 140 of FIG. 8 and FIG. 9 with an entire pattern in which a plurality of dots are drawn.

The display apparatus 10B of the third embodiment of FIG. 7, FIG. 8 and FIG. 9 is similar to the display apparatus 10A of the second embodiment of FIG. 4, FIG. 5 and FIG. 6. The main differences between the two are as follows. In the third embodiment of FIG. 7, FIG. 8 and FIG. 9, the first edge 130a of the first light-emitting element 130 and the first edge 222a of the first mesh 222 have a third light-transmitting gap g3, and the first conductive pattern 162 does not/or does not completely shield the third light-transmitting gap g3. In the third embodiment of FIG. 7, FIG. 8 and FIG. 9, the second edge 130b of the first light-emitting element 130 and the second edge 222b of the first mesh 222 have a fourth light-transmitting gap g4, and the second conductive pattern 164 does not/or does not completely shield the fourth light-transmitting gap g4. In the third embodiment of FIG. 7, FIG. 8 and FIG. 9, the second pad 152 and the first edge 224a of the second mesh 224 has the fifth light-transmitting gap g5, and the fourth conductive pattern 166 does not/or does not completely shield the fifth light-transmitting gap g5. In the third embodiment of FIG. 7, FIG. 8 and FIG. 9, another second pad 154 and the second edge 224b of the second mesh 224 have the sixth light-transmitting gap g6, and the fifth conductive pattern 168 does not/or does not completely shield the sixth light-transmitting gap g6.

Figure 10:
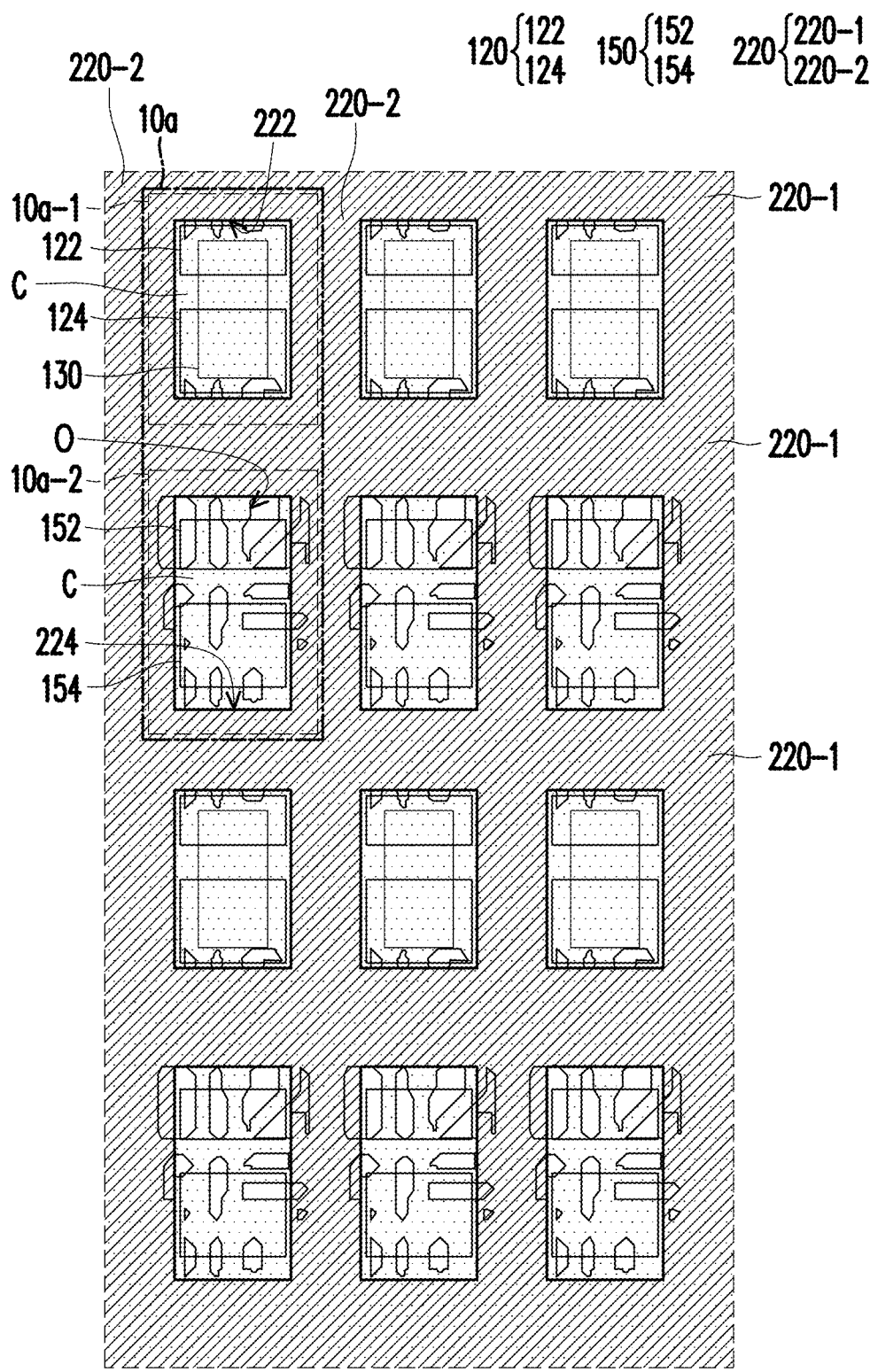
FIG. 10 is a schematic top view of the display apparatus of the fourth embodiment of the present disclosure.
Figures 11, 12:
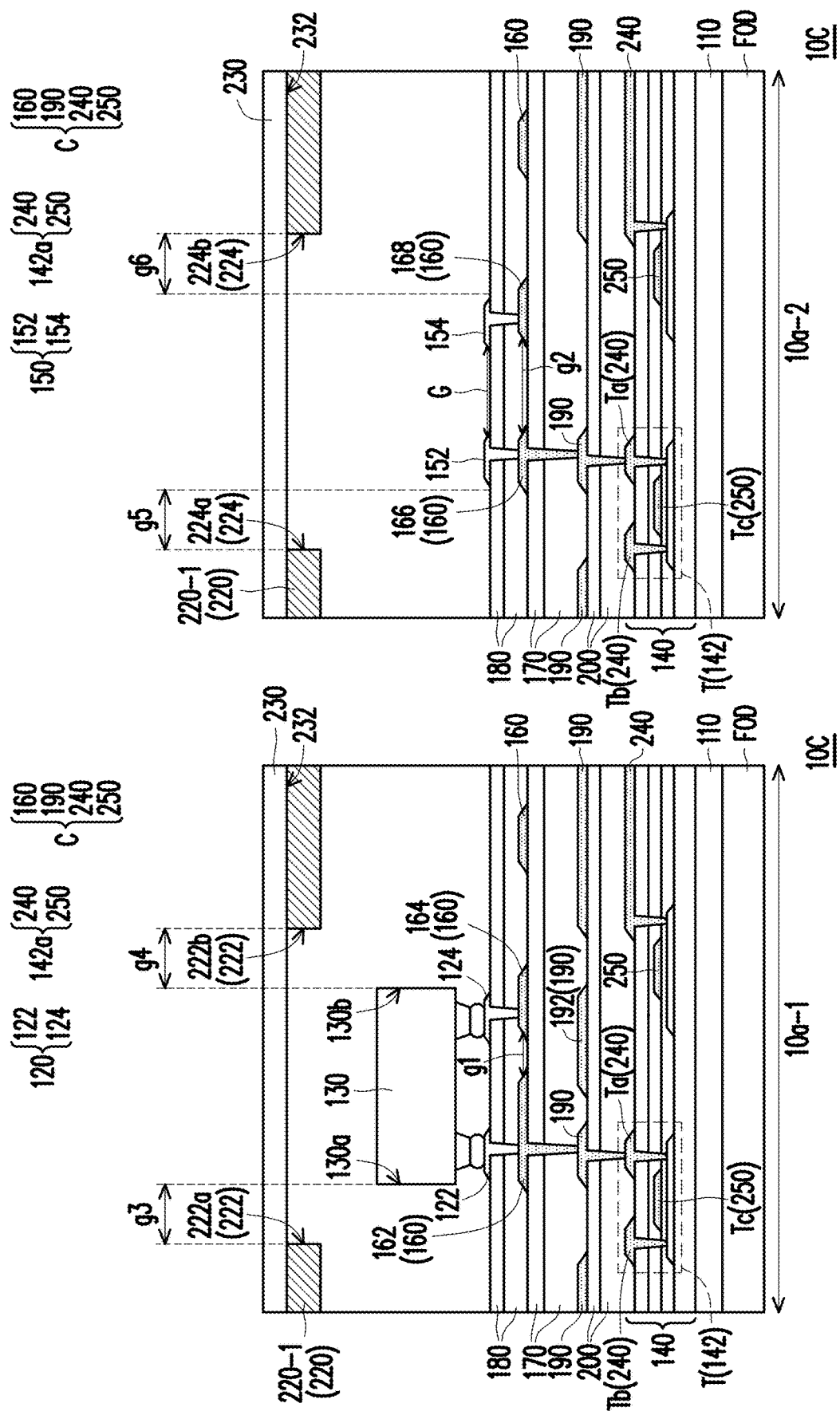
FIG. 11 is a schematic cross-sectional view of the main sub-area of the pixel area of the display apparatus according to the fourth embodiment of this disclosure.
FIG. 12 is a schematic cross-sectional view of the redundancy sub-area of the pixel area of the display apparatus according to the fourth embodiment of the present disclosure.

FIG. 10 is a schematic top view of the display apparatus of the fourth embodiment of the present disclosure. FIG. 11 is a schematic cross-sectional view of the main sub-area of the pixel area of the display apparatus according to the fourth embodiment of this disclosure. FIG. 12 is a schematic cross-sectional view of the redundancy sub-area of the pixel area of the display apparatus according to the fourth embodiment of the present disclosure. It should be noted that FIG. 10 represents a set C of the first conductive layer 160, the second conductive layer 190 and the light blocking portion 142a of the driving circuit layer 140 of FIG. 11 and FIG. 12 with an entire pattern in which a plurality of dots are drawn.

The display apparatus 10C of the fourth embodiment shown in FIG. 10, FIG. 11 and FIG. 12 is similar to the display apparatus 10B of the third embodiment shown in FIG. 7, FIG. 8 and FIG. 9. The main differences between the two are as follows. In the fourth embodiment of FIG. 10, FIG. 11 and FIG. 12, in the top view of the display apparatus 10C, right below the area of the plurality of first solid portions 220-1 of the mesh touch electrode 220, the set C of the light blocking portion 142a of the pixel driving structure 142, the solid portion of the conductive layer 160 and the solid portion of the second conductive layer 190 may not have an opening.

Figure 13:
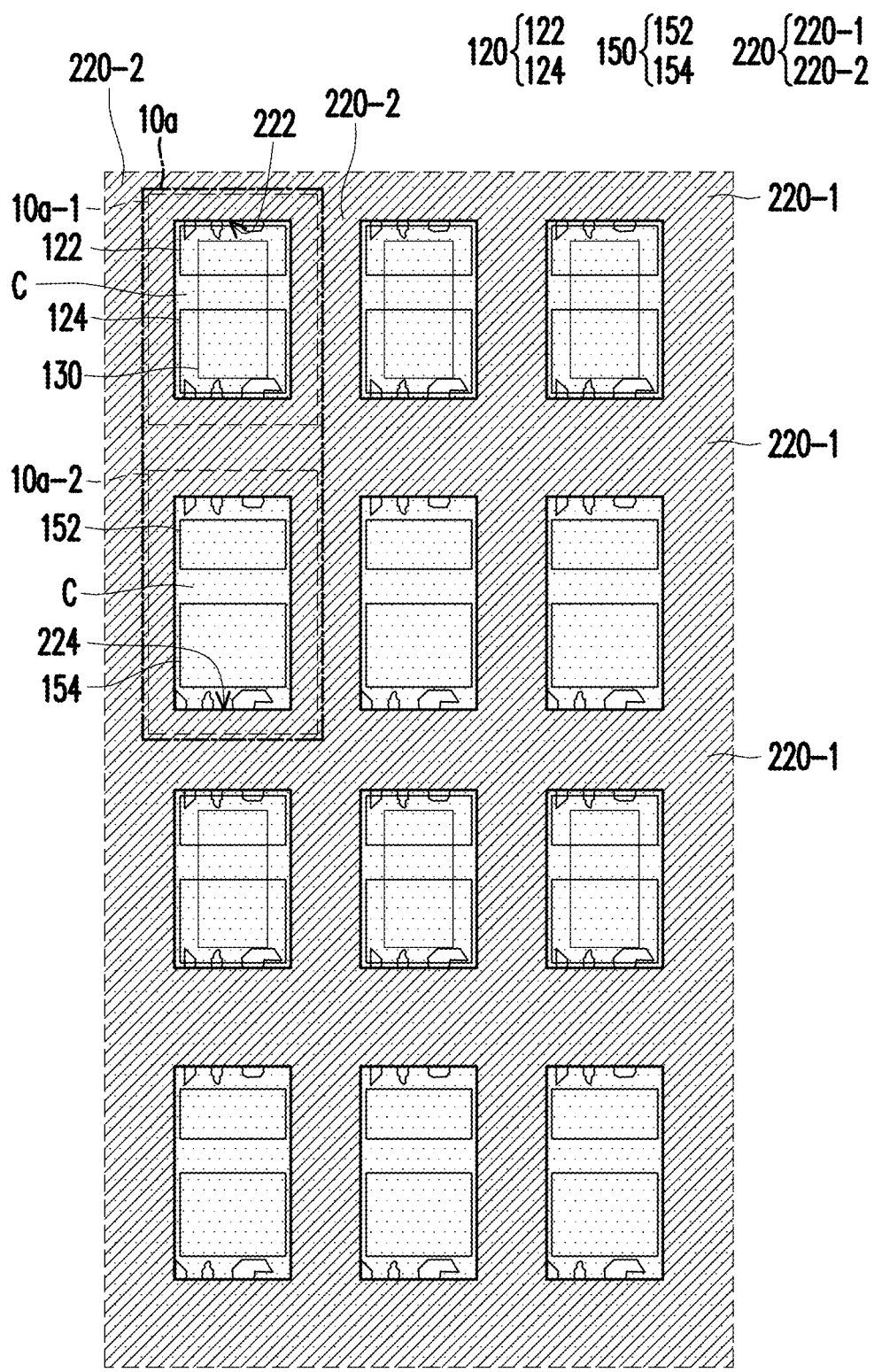
FIG. 13 is a schematic top view of the display apparatus of the fifth embodiment of the present disclosure.

FIG. 13 is a schematic top view of the display apparatus of the fifth embodiment of the present disclosure. FIG. 14 is a schematic cross-sectional view of the main sub-area of the pixel area of the display apparatus according to the fifth embodiment of this disclosure. FIG. 15 is a schematic cross-sectional view of the redundancy sub-area of the pixel area of the display apparatus according to the fifth embodiment of the present disclosure. It should be noted that FIG. 13 represents a set C of the first conductive layer 160, the second conductive layer 190 and the light blocking portion 142a of the driving circuit layer 140 of FIG. 14 and FIG. 15 with an entire pattern in which a plurality of dots are drawn.

The display apparatus 10D of the fifth embodiment shown in FIG. 13, FIG. 14 and FIG. 15 is similar to the display apparatus 10C of the fourth embodiment shown in FIG. 10, FIG. 11 and FIG. 12. The main differences between the two are as follows. In the fourth embodiment of FIG. 13, FIG. 14 and FIG. 15, the second conductive layer 190 further includes a sixth conductive pattern 194 shielding the second light-transmitting gap g2 the fourth conductive pattern 166 and the fifth conductive pattern 168. In addition, in the fourth embodiment of FIG. 13, FIG. 14 and FIG. 15, in the top view of the display apparatus 10D, the first solid portions 220-1 and the second solid portions 220-2 of the mesh touch electrode 220 may fall within the area of the set C of the light blocking portion 142a of the structure 142, the solid portion of the first conductive layer 160, and the solid portion of the second conductive layer 190.

Since the second conductive layer 190 further includes the sixth conductive pattern 194 shielding the second light-transmitting gap g2, when the display apparatus 10D needs to be repaired (that is, when the second light-emitting element for repair is disposed on the redundancy sub-area 10a-2), the light sensor FOD does not easily affected by the second light-emitting element used for repair. That is to say, when the number of second light-emitting elements for repair is large, the fingerprint image captured by the light sensor FOD of the display apparatus 10D can still have good quality when the screen is displayed. Although the transmittance of the display apparatus 10D is low, the light sensor FOD can receive sufficient light by increasing the exposure time of the light sensor FOD.

The following Table 1 lists the transmittance, an amount of internal reflection, an amount of external reflection and the ratio of the amount of external reflection to the amount of internal reflection of the display apparatus 10 of the first embodiment, the display apparatus 10A of the second embodiment, the display apparatus 10B of the third embodiment, the display apparatus 10C of the fourth embodiment, and the display apparatus 10D of the fifth embodiment. According Table 1 shown below, the amount of external reflection and the amount of internal reflection of the display apparatus 10 of the first embodiment, the display apparatus 10A of the second embodiment, the display apparatus 10B of the third embodiment, the display apparatus 10C of the fourth embodiment, and the display apparatus 10D of the fifth embodiment are greater than 100%. In other words, when the display apparatus 10, 10A, 10B, 10C, and 10D display images, the light sensor FOD can still capture fingerprint images normally, thereby realizing the fingerprint recognition function.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A display apparatus comprising:
    a first pad group comprising first pads;
    a first light-emitting element, bonded to the first pads;
    a pixel driving structure;
    a first conductive layer, disposed between the first pad group and the pixel driving structure and comprising:
        a first conductive pattern, electrically connected to one of the first pads and the pixel driving structure; and
        a second conductive pattern, separated from the first conductive pattern, wherein the second conductive pattern is electrically connected to another one of the first pads, the first conductive pattern and the second conductive pattern have a first light-transmitting gap, and the first light-transmitting gap is located below the first light-emitting element; and
    a second conductive layer disposed between the first conductive layer and the pixel driving structure, and comprising:
        a third conductive pattern, shielding the first light-transmitting gap of the first conductive pattern and the second conductive pattern.

2. The display apparatus according to claim 1, further comprising:
    a second pad group disposed beside the first pad group and comprising second pads, wherein the second pads are electrically connected to the first pads respectively, and the second pads have a pad gap;
    the first conductive layer further comprising:
        a fourth conductive pattern electrically connected one of the second pads and the pixel driving structure; and
        a fifth conductive pattern separated from the fourth conductive pattern, wherein the fifth conductive pattern is electrically connected to another one of the second pads, the fourth conductive pattern and the fifth conductive pattern have a second light-transmitting gap, and the second light-transmitting gap is located below the pad gap of the second pads;
    the second conductive layer further comprising:
        a sixth conductive pattern, shielding the second light-transmitting gap of the fourth conductive pattern and the fifth conductive pattern.

TABLE 1

|  | the first embodiment | the second embodiment | the third embodiment | the fourth embodiment | the fifth embodiment |
|---|---|---|---|---|---|
| transmittance(%) | 4.10 | 4.10 | 4.69 | 4.69 | 1.49 |
| an amount of internal reflection (nits) | 7.6 | 8.0 | 9.3 | 10.5 | 3.7 |
| an amount of external reflection (nits) | 27.2 | 27.3 | 30.4 | 30.2 | 10.9 |
| an amount of external reflection/ an amount of internal reflection (%) | 355 | 339 | 326 | 287 | 296 |

3. The display apparatus according to claim 1, further comprising:
  a mesh touch electrode having a first mesh, wherein the first light-emitting element is disposed below the first mesh, and the first light-emitting element is located between the mesh touch electrode and the first pad group;
  a first edge of the first light-emitting element and a first edge of the first mesh have a third light-transmitting gap, the first conductive pattern extends from below the one of the first pads to below the mesh touch electrode to shield the third light-transmitting gap.

4. The display apparatus according to claim 3, wherein the first mesh of the mesh touch electrode further has a second edge, the second edge of the first mesh is opposite to the first edge of the first mesh, the first light-emitting element further has a second edge, the second edge of the first light-emitting element is opposite to the first edge of the first light-emitting element, the second edge of the first light-emitting element and the second edge of the first mesh have a fourth light-transmitting gap, the second conductive pattern extends from below the another one of the first pads to below the mesh touch electrode to shield the fourth light-transmitting gap.

5. The display apparatus according to claim 4, wherein the mesh touch electrode further has a second mesh located outside the first mesh, and the display apparatus further comprises:
  a second pad group disposed beside the first pad group and comprising second pads, wherein the second pads are electrically connected to the first pads respectively, and the second pads are located below the second mesh of the mesh touch electrode;
  the first conductive layer further comprising:
    a fourth conductive pattern electrically connected to one of the second pads and the pixel driving structure; and
    a fifth conductive pattern separated from the fourth conductive pattern, wherein the fifth conductive pattern is electrically connected to another one of the second pads;
  wherein the one of the second pads and a first edge of the second mesh have a fifth light-transmitting gap, and the fourth conductive pattern extends from below the one of the second pads to below the mesh touch electrode to shield the fifth light-transmitting gap.

6. The display apparatus according to claim 5, wherein the second mesh of the mesh touch electrode further has a second edge, the second edge of the second mesh is opposite to the first edge of the second mesh, the another one of the second pads and the second edge of the second mesh have a sixth light-transmitting gap, the fifth conductive pattern extends from below the another one of the second pads to below the mesh touch electrode to shield the sixth light-transmitting gap.

7. The display apparatus according to claim 1, further comprising:
  a mesh touch electrode having first solid portions and second solid portions, wherein the first solid portions intersect with the second solid portions to define a first mesh of the mesh touch electrode, the first light-emitting element is disposed below the first mesh, and the first light-emitting element is located between the mesh touch electrode and the first pad group;
  the first solid portions of the mesh touch electrode fall within a set area of a light blocking portion of the pixel driving structure, a solid portion of the first conductive layer, and a solid portion of the second conductive layer.

8. The display apparatus according to claim 7, wherein the second solid portions of the mesh touch electrode fall within a set area of the light blocking portion of the pixel driving structure, the solid portion of the first conductive layer, and the solid portion of the second conductive layer.

* * * * *